US012593560B2

(12) United States Patent
Kitamura

(10) Patent No.: US 12,593,560 B2
(45) Date of Patent: Mar. 31, 2026

(54) LIGHT-EMITTING ELEMENT AND DISPLAY DEVICE

(71) Applicant: SHARP KABUSHIKI KAISHA, Sakai City (JP)

(72) Inventor: Ryo Kitamura, Sakai City (JP)

(73) Assignee: SHARP KABUSHIKI KAISHA, Sakai City (JP)

(*) Notice: Subject to any disclaimer, the term of this patent is extended or adjusted under 35 U.S.C. 154(b) by 445 days.

(21) Appl. No.: 17/791,809

(22) PCT Filed: Jan. 30, 2020

(86) PCT No.: PCT/JP2020/003527
§ 371 (c)(1),
(2) Date: Jul. 8, 2022

(87) PCT Pub. No.: WO2021/152791
PCT Pub. Date: Aug. 5, 2021

(65) Prior Publication Data
US 2023/0041812 A1 Feb. 9, 2023

(51) Int. Cl.
H10K 50/115 (2023.01)
H10K 50/10 (2023.01)
(Continued)

(52) U.S. Cl.
CPC .......... H10K 50/115 (2023.02); H10K 50/10 (2023.02); H10K 50/15 (2023.02); H10K 59/12 (2023.02)

(58) Field of Classification Search
CPC .............. H10K 50/155; H10K 50/115; H10K 50/10–181; H10K 50/156; H10K 50/157;
(Continued)

(56) References Cited

U.S. PATENT DOCUMENTS

2005/0088078 A1* 4/2005 Tseng ..................... H10K 50/85
313/504
2006/0188745 A1* 8/2006 Liao ....................... H10K 50/19
428/917
(Continued)

FOREIGN PATENT DOCUMENTS

CN 105261707 A 1/2016
CN 106374051 A 2/2017
CN 109449317 A 3/2019

OTHER PUBLICATIONS

Wenyu Ji et. Al., "Over 800% efficiency enhancement of all-inorganic quantum-dot light emitting diodes with an ultrathin alumina passivating layer r", Nanoscale, Jun. 1, 2018, 10(23):11103-11109.

*Primary Examiner* — Chad M Dicke
*Assistant Examiner* — Mario Andres Autore, Jr.
(74) *Attorney, Agent, or Firm* — ScienBiziP, P.C.

(57) ABSTRACT

In order to realize a light-emitting element having high luminous efficiency in a light-emitting device with quantum dots, the light-emitting element including a hole transport layer and a light-emitting layer including a quantum dot luminescent body, the hole transport layer and the light-emitting layer being layered on each other is provided. The hole transport layer includes a compound of one or more of $Cu^+$, $Ag^+$, and $Au^+$, and one or more of $I^-$, $SCN^-$, $SeCN^-$, and $CN^-$.

6 Claims, 12 Drawing Sheets

(51) Int. Cl.
  *H10K 50/15*   (2023.01)
  *H10K 59/12*   (2023.01)
(58) Field of Classification Search
  CPC ....... H01L 33/14; H01L 33/145; H01L 33/28;
        H01L 33/285; H05B 33/14–22; H10H
        20/816; H10H 20/8162; H10H 20/812;
        H10H 20/815; H10H 20/811
  See application file for complete search history.

(56)              References Cited

U.S. PATENT DOCUMENTS

| | | | |
|---|---|---|---|
| 2012/0292594 A1* | 11/2012 | Zhou .................... | H10K 50/115 |
| | | | 977/773 |
| 2013/0240829 A1* | 9/2013 | Kuramachi ....... | H01L 21/02381 |
| | | | 359/326 |
| 2014/0225513 A1* | 8/2014 | Park ...................... | H05B 45/14 |
| | | | 315/151 |
| 2014/0291479 A1* | 10/2014 | Lu ........................... | H10F 30/10 |
| | | | 438/69 |
| 2016/0363708 A1* | 12/2016 | You ........................ | G02B 6/005 |
| 2018/0166643 A1* | 6/2018 | Kim .................... | H10K 50/115 |
| 2021/0013437 A1* | 1/2021 | Su ........................... | H10K 50/15 |

* cited by examiner

Al 100nm

ZnO 50nm

QD 50nm

CuSCN 50nm

ITO 30nm

SUBSTRATE

Al 100nm
ZnO 50nm
QD 50nm
PMMA 5nm
CuSCN 50nm
ITO 30nm
SUBSTRATE

LIGHT-EMITTING ELEMENT AND DISPLAY DEVICE

TECHNICAL FIELD

The disclosure relates to a light-emitting element and a display device.

BACKGROUND ART

Many light-emitting elements with quantum dots have been proposed as devices using quantum dots.

In NPL1, in a self-luminous type image display device (here, a QLED display) using an inorganic material, an $Al_2O_3$ layer is layered on an NiO layer constituting a hole transport layer, by using ALD. Thus, it is disclosed that an influence of a hydroxyl group present on a surface of the NiO layer is suppressed, and external quantum efficiency is improved.

CITATION LIST

Non Patent Literature

NPL1: Over 800% efficiency enhancement of all-inorganic quantum-dot light emitting diodes with an ultrathin alumina passivating layer r, Wenyu Ji et. al., Nanoscale, 2018, 10, 11103-11109

SUMMARY

Technical Problem

In a case where an NiO layer is used as a hole transport layer as described in NPL1, a local electric field is generated due to the presence of a hydroxyl group on a surface of the NiO layer, and light emission of a light-emitting layer is prevented by the local electric field. Furthermore, since an oxygen ion in the constituent component of NiO has a high charge density, a large surface electric field is generated at a bonding end, which is one of the causes of a decrease in luminous efficiency.

Solution to Problem

To solve the problem described above, a light-emitting element according to one aspect of the disclosure includes a hole transport layer and a light-emitting layer including a quantum dot luminescent body layered on each other, wherein the hole transport layer includes a compound of one or more of $Cu^+$, $Ag^+$, and $Au^+$, and one or more of $I^-$, $SCN^-$, $SeCN^-$, and $CN^-$.

Advantageous Effects of Disclosure

According to one aspect of the disclosure, it is possible to suppress generation of a local electric field at a bonding end of a compound containing a cation or an anion having a high charge density, and thus a light-emitting element having high luminous efficiency can be realized.

DESCRIPTION OF EMBODIMENTS

First Embodiment

In the present specification, a direction from an array substrate to a light-emitting layer is referred to as an "upward direction", and a direction from the light-emitting layer to the array substrate is referred to as a "downward direction".

Figure 1:
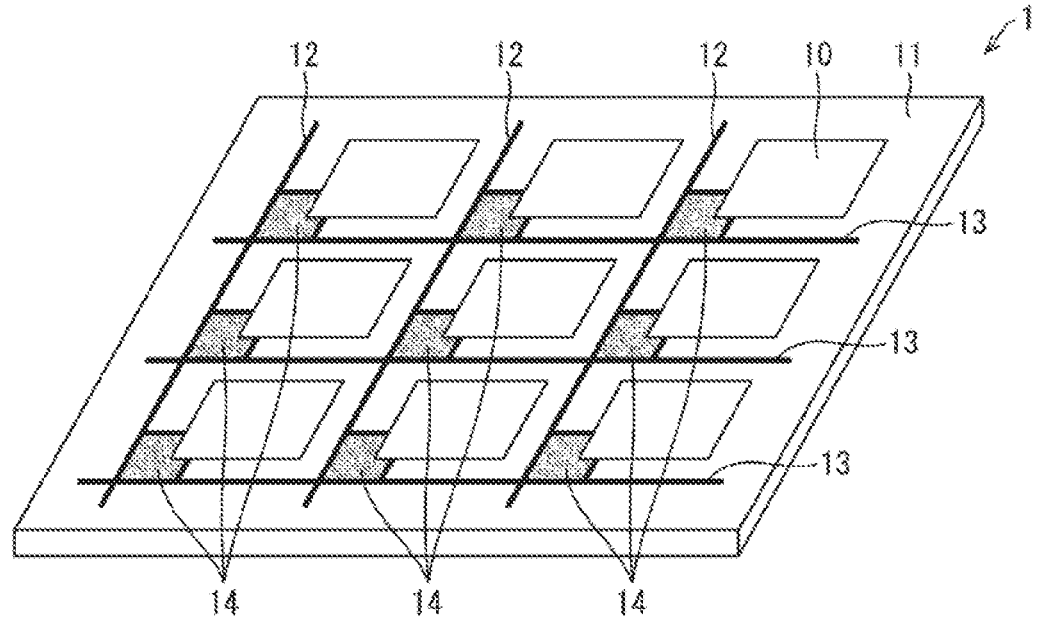
FIG. 1 is a schematic configuration of a display device according to the disclosure.
Figure 2:
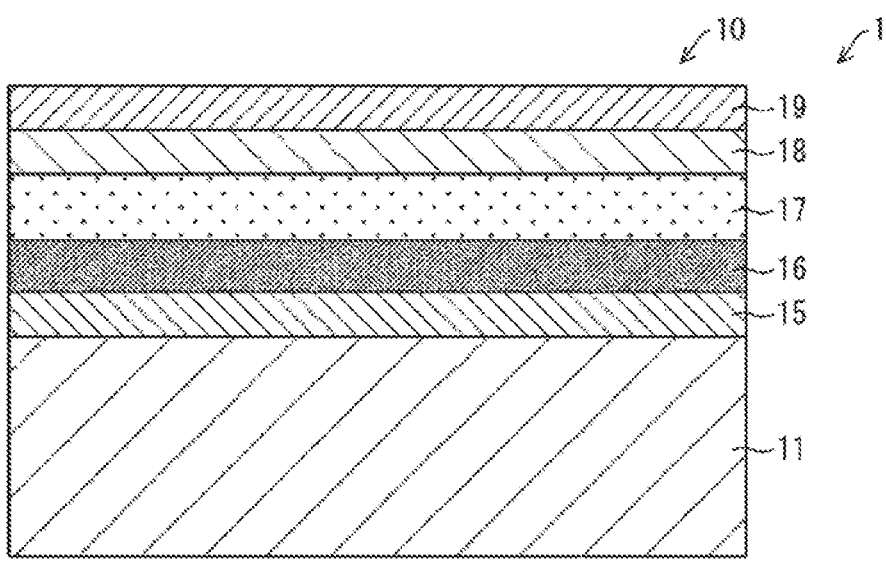
FIG. 2 is a schematic cross-sectional view of a display device according to a first embodiment of the disclosure.

A light-emitting element according to the present embodiment will be described with reference to FIG. 1 to FIG. 4. FIG. 1 is a view illustrating a schematic configuration of a display device 1 using a light-emitting element 10 according to the present embodiment. FIG. 2 is a view illustrating a schematic cross-section of the display device 1 according to the present embodiment.

As illustrated in FIG. 1, in the display device 1, the light-emitting element 10, source lines 12, gate lines 13, and thin film transistors (TFTs) 14 are formed on an array substrate 11.

The array substrate 11 is a substrate on which a subpixel circuit is formed. The subpixel circuit formed on the array substrate 11 includes the TFTs 14 that are thin film transistors. A material of a base material of the array substrate 11 may be glass or may be bendable plastic or the like. In a case where plastic or the like is used for the material of the base material of the array substrate 11, a display device 1 having flexibility can be obtained.

Each of the source lines 12 is a signal line for electrically connecting to a source electrode of a corresponding one of TFTs 14, and applying a source signal including a data signal or the like to the TFT 14. The source lines 12 can be formed, for example, by forming a conductive thin film by a method such as vacuum vapor deposition or sputtering using a conductive material, and then patterning the conductive thin film by a photolithography method or a lift-off method. The source lines 12 may be formed by, for example, an etching method using a resist by thermal transfer, ink-jet, or the like on a metal foil.

Each of the gate lines 13 is a signal line for electrically connecting to a gate electrode of a corresponding one of TFTs 14, and applying a signal including a scan signal or the like to the TFT 14. The gate lines 13 can be formed, for example, by forming a conductive thin film by a method such as vacuum vapor deposition or sputtering using a conductive material, and then patterning the conductive thin film by a photolithography method or a lift-off method. The gate lines 13 may be formed by, for example, an etching method using a resist by thermal transfer, ink-jet, or the like on a metal foil.

Each of the TFTs 14 includes layers including a wiring line layer and the like formed on the array substrate 11. The TFT 14 controls the light emission of the light-emitting element 10 by driving at least one of an anode 15 and a cathode 19 described below. For example, in the present embodiment, the light emission of the light-emitting element 10 may be controlled by applying a constant voltage to an electrode of the one of the anode 15 and the cathode 19, and driving an electrode of the other of the anode 15 and the cathode 19 via the TFT 14. Each layer such as the wiring line layer of the TFT 14 may be formed by forming the layer in a thin film by vacuum vapor deposition, sputtering, chemical vapor deposition using plasma (plasma CVD), or the like, and then patterning the layer.

The light-emitting element 10 is formed so as to correspond to the TFT 14 provided at each intersection of the source lines 12 and the gate lines 13.

The light-emitting element 10 includes a hole transport layer 16 and a light-emitting layer 17 layered on each other. As illustrated in FIG. 2, the light-emitting element 10 of the present embodiment includes the anode 15, the hole transport layer 16, the light-emitting layer 17, an electron transport layer 18, and the cathode 19. In the example of FIG. 2, the light-emitting element 10 has a forward structure type in which the anode 15, the hole transport layer 16, the light-emitting layer 17, the electron transport layer 18, and the cathode 19 are sequentially layered from the array substrate 11 side. However, the light-emitting element 10 may have an inverted structure type in which the cathode 19, the electron transport layer 18, the light-emitting layer 17, the hole transport layer 16, and the anode 15 are sequentially layered from the array substrate 11 side.

The anode 15 is provided on the array substrate 11, and is electrically connected to the TFT 14. As a material of the anode 15, for example, a conductive material such as a metal or a transparent oxide is used, and the anode 15 can be formed by film formation by sputtering or the like.

The hole transport layer 16 is electrically connected to the anode 15 and the light-emitting layer 17. The hole transport layer 16 has a function of transporting positive holes injected from the anode 15 into the light-emitting layer 17. The hole transport layer 16 may have a function of inhibiting transport of electrons from the light-emitting layer 17 to the anode 15. The hole transport layer 16 can be formed by film formation by sputtering or the like.

The light-emitting layer 17 is electrically connected to the hole transport layer 16 and the electron transport layer 18. The light-emitting layer 17 may be a plurality of the quantum dot luminescent bodies (semiconductor nanoparticles, not illustrated), and may include a ligand (not illustrated) coordinated to each of the plurality of quantum dot luminescent bodies. Each of the plurality of quantum dot luminescent bodies may have a core/shell structure having, for example, a core and a shell serving as an outer shell of the core. The light-emitting layer 17 may be obtained by layering a plurality of the light-emitting layers.

The quantum dot luminescent bodies in the light-emitting layer 17 may be selected as appropriate from materials utilized in this field. The quantum dot luminescent bodies may include one or a plurality of semiconductor materials selected from a group composed of, for example, CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, and MgTe and combinations thereof. The light-emitting layer 17 may be formed by a method such as a coating method including an ink-jet method, photolithography, and electrodeposition.

The quantum dot luminescent bodies are a luminescent material that has a valence band level and a conduction band level and emits light through recombination of a positive hole at the valence band level with an electron at the conduction band level. Because light emitted from the quantum dot luminescent bodies has a narrower spectrum due to a quantum confinement effect, it is possible to obtain light emission with relatively deep chromaticity.

The electron transport layer 18 is provided on the light-emitting layer 17, and is electrically connected to the cathode 19. The electron transport layer 18 has a function of transporting electrons injected from the cathode 19 into the light-emitting layer 17. The electron transport layer 18 may have a function of inhibiting transport of positive holes from the light-emitting layer 17 to the cathode 19. The electron transport layer 18 may include, for example, ZnO nanoparticles, MgZnO nanoparticles, or the like, and may be formed by a method such as a coating method, a vacuum vapor deposition method, or sputtering.

The cathode 19 is provided on the electron transport layer 18. As a material of the cathode 19, for example, a conductive material such as a metal or a transparent oxide is used, and the cathode can be formed by film formation by sputtering or the like.

The light-emitting element 10 is driven via the TFT 14, a voltage is applied across the anode 15 and the cathode 19 to generate a potential difference between the anode 15 and the cathode 19. Thus, the positive holes are injected from the anode 15 into the hole transport layer 16, and the electrons are injected from the cathode 19 into the electron transport layer 18. The positive holes injected into the hole transport layer 16 and the electrons injected into the electron transport layer 18 are then transported to the light-emitting layer 17. The positive holes and electrons then recombine with each other in the quantum dot luminescent bodies in the light-emitting layer 17, thus excitons are generated in the quantum dot luminescent bodies, and the light is emitted from the quantum dot luminescent bodies. Thus, the light is emitted from the light-emitting layer 17 of the light-emitting element 10.

The display device 1 according to the present embodiment is a top-emitting type display device in which the light from the light-emitting layer 17 is extracted in a direction from the array substrate 11 to the light-emitting element 10. Thus, the anode 15 may be an electrode formed of a metal, and may be an electrode formed of a transparent conductive film. By using a metal having a high reflectivity of visible light as the anode 15, the light emitted downward from the light-emitting layer 17 is efficiently reflected, and thus the light emitted from the light-emitting layer 17 can be efficiently utilized. Thus, the anode 15 is preferably an electrode formed of Al, Cu, Au, Ag, or the like having the high reflectivity of the visible light. In a case where the electrode formed of the transparent conductive film is used as the anode 15, a transparent conductive film including a transparent oxide such as ITO, IZO, ZnO, AZO, or BZO may be used.

Since the display device 1 according to the present embodiment is the top-emitting type display device, the cathode 19 is an electrode formed of a transparent conductive film. Similarly to the anode 15, the transparent conductive film includes a transparent oxide such as ITO, IZO, ZnO, AZO, or BZO, and can be formed by film formation by sputtering or the like.

The display device 1 according to the present embodiment may be a bottom-emitting type display device in which the light from the light-emitting layer 17 is extracted in a direction from the light-emitting element 10 to the array substrate 11. In a case of the bottom-emitting type display device, the anode 15 may be an electrode formed of the transparent conductive film. The cathode 19 may be an electrode formed of a metal, and may be an electrode formed of the transparent conductive film. By using a metal having a high reflectivity of visible light as the cathode 19, the light emitted upward from the light-emitting layer 17 is efficiently reflected, and thus the light emitted from the light-emitting layer 17 can be efficiently utilized. Thus, in the case of the bottom-emitting type display device, the cathode 19 is preferably the electrode formed of Al, Cu, Au, Ag, or the like having the high reflectivity of the visible light. In a case where the electrode formed of the transparent conductive film is used as the cathode 19, a transparent conductive film including a transparent oxide such as ITO, IZO, ZnO, AZO, or BZO may be used.

In the present embodiment, the hole transport layer 16 contains a compound of one or more of $Cu^+$, $Ag^+$, and $Au^+$, and one or more of $I^-$, $SCN^-$, $SeCN^-$, and $CN^-$.

Here, Cu, Ag, and Au are all Group 11 metals, and ions of these metals are cations each tending to have a low charge density and have a large atomic radius. $I^-$, $SCN^-$, $SeCN^-$, and $CN^-$ are halide groups or pseudohalide groups, which are anions each tending to have a low charge density and have a large atomic radius.

In the compound composed of one or more of $Cu^+$, $Ag^+$, and $Au^+$, and one or more of $I^-$, $SCN^-$, $SeCN^-$, and $CN^-$, each ion has the low charge density, and thus the electric field at the bonding end of each ion is small. Thus, the compound described above is an ion bonding material having weak polarization at the bonding end of each ion. As a result, the hole transport layer 16 which contains the compound described above can suppress the generation of a local electric field due to the polarization at the surface of the hole transport layer 16 that is the bonding end of each ion. As a result, the inhibition of the transport and the injection of the positive holes from the hole transport layer 16 to the light-emitting layer 17 due to the local electric field is suppressed, and thus a reduction in luminous efficiency can be suppressed.

In particular, in a case where the hole transport layer 16 contains CuSCN, the hole transport layer 16 has a relatively low electron affinity and a high ionization potential. Thus, the hole transport layer 16 containing CuSCN has the low electron affinity, and thus a barrier of electron injection from the light-emitting layer 17 to the hole transport layer 16 increases. Thus, the hole transport layer 16 contains CuSCN, and thus, it is possible to reduce the transport of electrons from the light-emitting layer 17 to the anode electrode side and improve electron density in the light-emitting layer 17.

The hole transport layer 16 containing CuSCN has the high ionization potential. As a result, the injection barrier of the positive holes from the hole transport layer 16 to the light-emitting layer 17 is smaller, and the injection efficiency of the positive holes to the light-emitting layer 17 can be improved. As a result, the hole density in the light-emitting layer 17 can be improved. Thus, the hole transport layer 16 preferably contains CuSCN.

Figure 3:
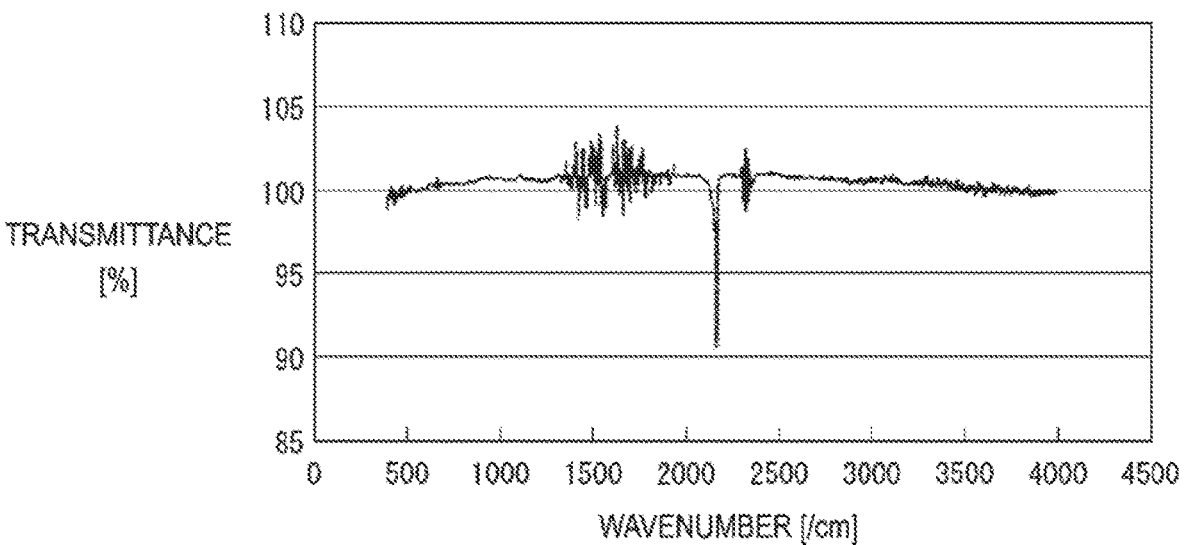
FIG. 3 is an FTIR spectrum of a CuSCN film.
Figure 4:
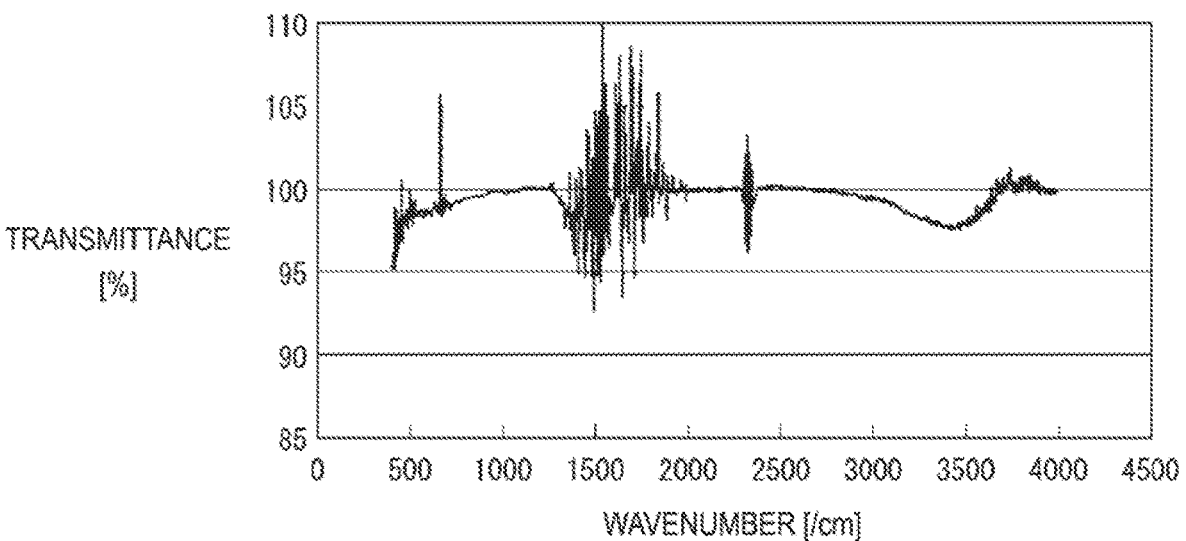
FIG. 4 is an FTIR spectrum of an NiO film.

Here, the effect of the hole transport layer 16 containing CuSCN will be described in further detail with reference to FIG. 3 and FIG. 4, FIG. 3 is a measurement result of infrared spectral spectroscopy performed on a surface of a CuSCN film. FIG. 4 is a measurement result of infrared spectral spectroscopy performed on a surface of an NiO film. In particular, FIG. 3 and FIG. 4 are measurement results of infrared spectral spectroscopy performed on the surfaces of the CuSCN film and the NiO film, respectively, by using a Fourier transform infrared spectrophotometer (FTIR).

In FIG. 4, a peak of infrared absorption indicating the presence of hydroxyl groups is observed in a relatively wide wavenumber region around a wavenumber of 3500/cm. In other words, the measurement result of FIG. 4 indicates that the hydroxyl groups are formed on the surface of the NiO film. Thus, in a case where the hole transport layer 16 contains NiO as a material, the hydroxyl groups having a strong polarization are generated on the surface of the hole transport layer 16 closer to the light-emitting layer 17 side, and the injection of the positive holes from the hole transport layer 16 to the light-emitting layer 17 is inhibited.

On the other hand, in FIG. 3, the peak of the infrared absorption indicating the presence of hydroxyl groups is not observed in the relatively wide wavenumber region around a wavenumber of 3500/cm. In other words, the measurement result of FIG. 3 indicates that the hydroxyl groups are not formed on the surface of the CuSCN film. As described above, CuSCN is a compound composed of the cation and the anion having the low charge density, and thus the polarization tends to be small. Thus, in a case where the hole transport layer 16 contains CuSCN as the material, it is also clear from FIG. 3 that the generation of the local polarization at the surface of the hole transport layer 16 closer to the light-emitting layer 17 side is suppressed, and thus the inhibition of the injection of the positive holes from the hole transport layer 16 to the light-emitting layer 17 is suppressed.

In a case where the hole transport layer 16 is a layered structure, a layer, adjacent to the light-emitting layer 17, of the hole transport layer 16 contains the compound of one or more of $Cu^+$, $Ag^+$, and $Au^+$, and one or more of $I^-$, $SCN^-$, $SeCN^-$, and $CN^-$, and thus the formation of the hydroxyl groups due to moisture in the air on the surface of the layer, adjacent to the light-emitting layer 17, of the hole transport layer 16 can be suppressed, and further the polarization on the surface can be suppressed, and thus the light-emitting layer 17 having the high luminous efficiency can be obtained. Thus, in the case where the hole transport layer 16 is the layered structure, the layer, adjacent to the light-emitting layer 17, of the hole transport layer 16 preferably contains the compound of one or more of $Cu^+$, $Ag^+$, and $Au^+$, and one or more of $I^-$, $SCN^-$, $SeCN^-$, and $CN^-$.

It is preferable that the thickness of the layer, adjacent to the light-emitting layer 17, of the hole transport layer 16 be 1 nm or more, because contact with a layer other than the layer adjacent to the light-emitting layer 17 can be prevented. Note that, in the present specification, the expression that two layers "are adjacent to each other" indicates a state in which the two members are in contact with each other or a state in which the two members are adjacent to each other with a thin film interposed therebetween.

In a case where a CuSCN thin film is formed as the hole transport layer 16 in the method of forming the hole transport layer 16, a method in which a coating solution is formed using CuSCN powder and the CuSCN thin film is formed by a spin coating method is most convenient and hence preferable. In a method of forming the coating solution in the spin coating method, the CuSCN powder may be dissolved in diethyl sulfide or dipropylene sulfide. In the method of forming the coating solution in the spin coating method, the CuSCN powder may be melted into a mixed solution of aminopropanol and methoxy ethanol. As a method of forming the CuSCN thin film by a method other than the spin coating method, a method of performing electrodeposition on an electrolyte in which copper(II) sulfate and potassium thiocyanate are dissolved in ethylenediaminetetraacetic acid may be used.

Second Embodiment

Figure 5:
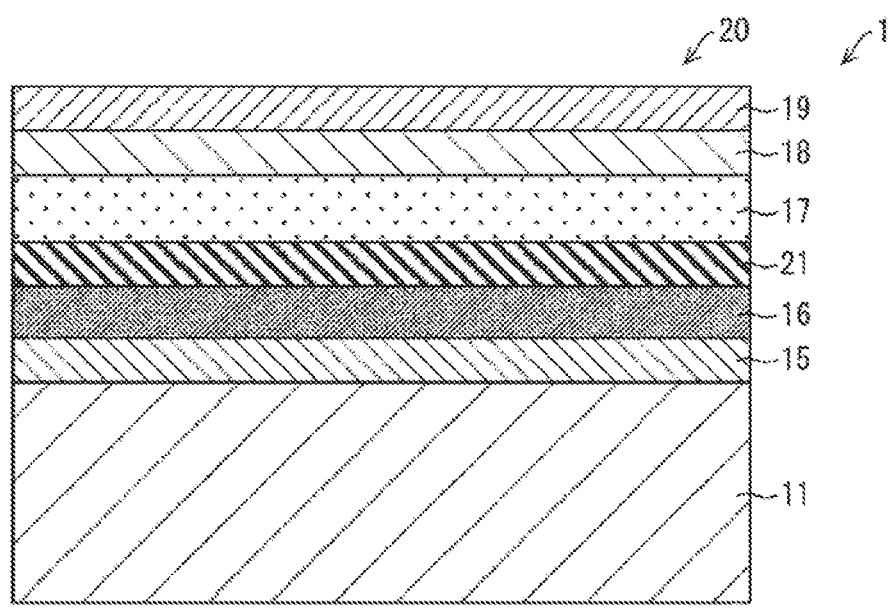
FIG. 5 is a schematic cross-sectional view of a display device according to a second embodiment of the disclosure.
Figure 6:
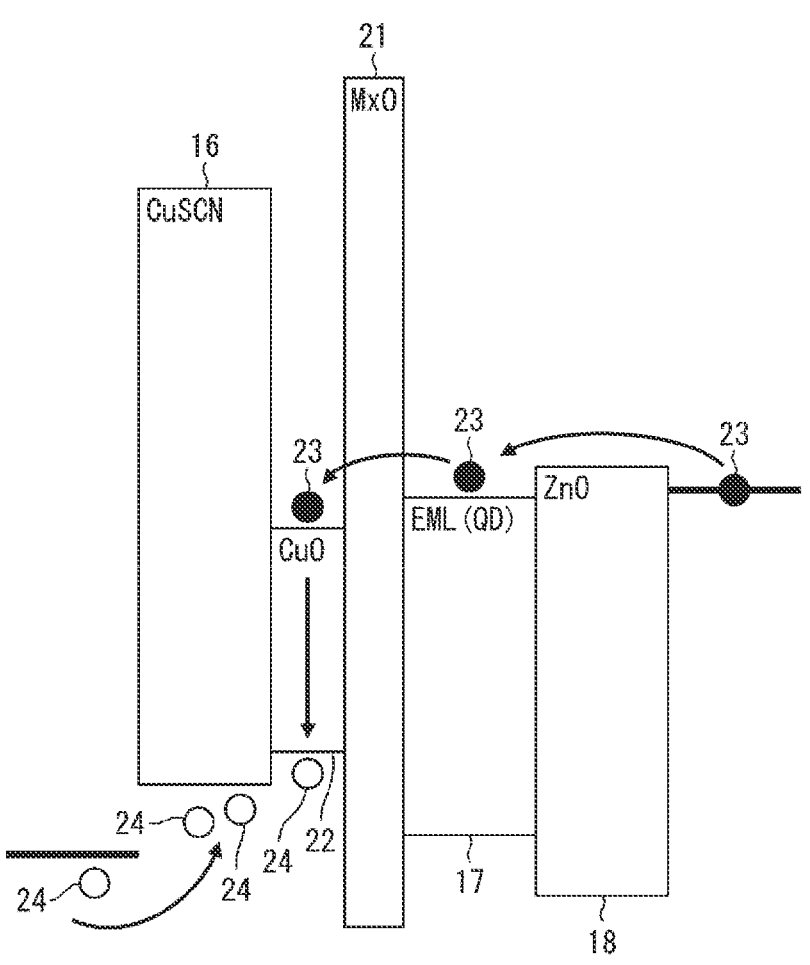
FIG. 6 is a schematic view of a transition of positive holes and electrons in a case where a metal oxide is used as an intermediate layer.
Figure 7:
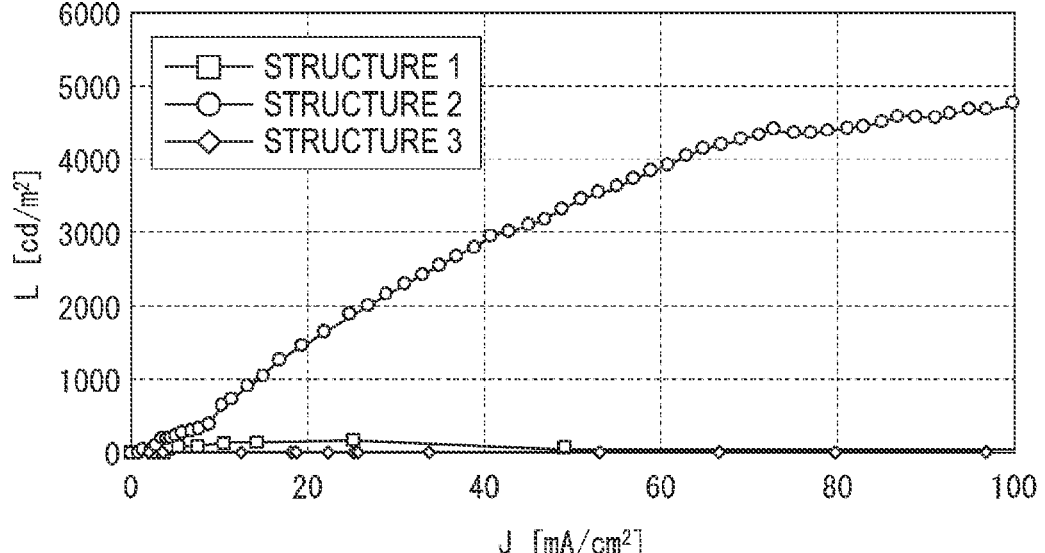
FIG. 7 is a diagram showing influence of the intermediate layer on luminance in a light-emitting element according to the second embodiment of the disclosure.
Figure 8:
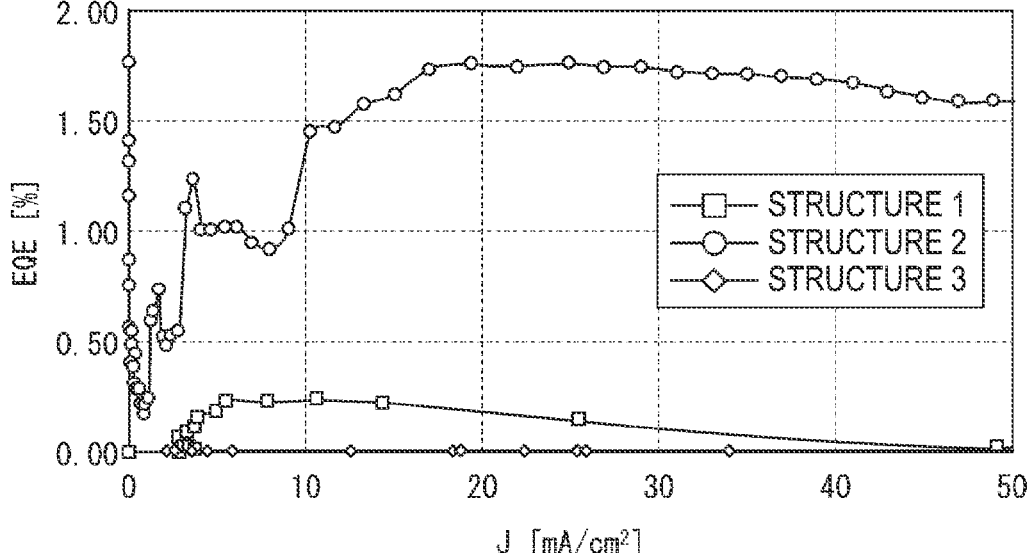
FIG. 8 is a diagram showing influence of the intermediate layer on external quantum efficiency in the light-emitting element according to the second embodiment of the disclosure.
Figure 9:
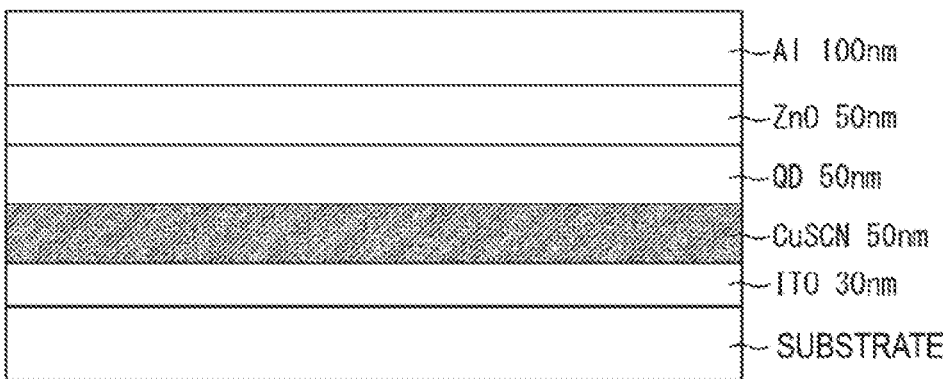
FIG. 9 is a schematic cross-sectional view of a structure 1 shown in FIG. 7 and FIG. 8.
Figure 10:
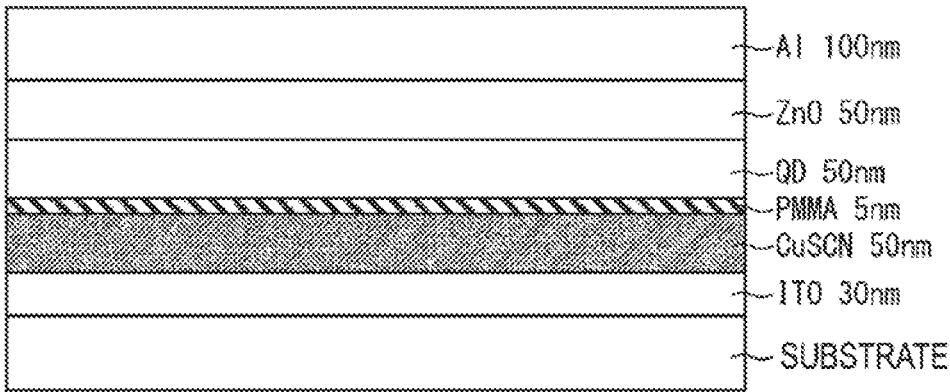
FIG. 10 is a schematic cross-sectional view of a structure 2 shown in FIG. 7 and FIG. 8.
Figure 11:
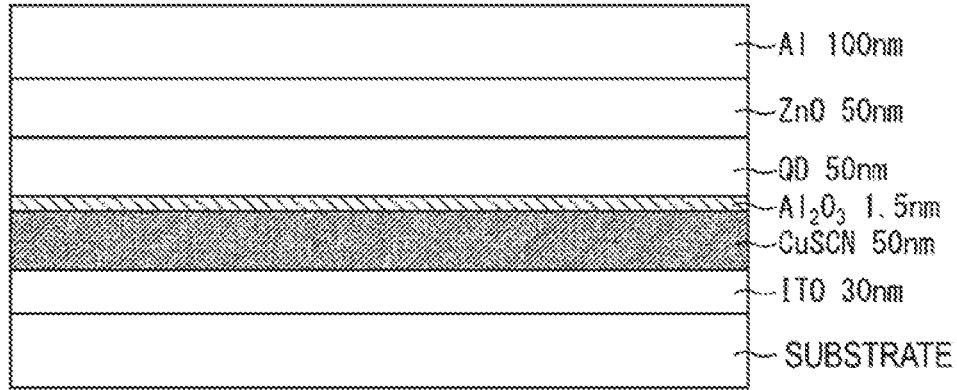
FIG. 11 is a schematic cross-sectional view of a structure 3 shown in FIG. 7 and FIG. 8.

A light-emitting element according to a second embodiment will be described with reference to FIGS. 5 to FIG. 11. FIG. 5 is a schematic cross-sectional view of a display device according to the second embodiment. FIG. 6 is a schematic view of a transition of positive holes and electrons in a case where a metal oxide is used as an intermediate layer. FIG. 7 is a diagram showing influence of the intermediate layer on luminance in a light-emitting element according to the second embodiment. FIG. 8 is a diagram showing influence of the intermediate layer on external quantum efficiency in the light-emitting element according to the second embodiment. FIG. 9 is a schematic cross-sectional view of a structure 1 shown in FIG. 7 and FIG. 8. FIG. 10 is a schematic cross-sectional view of a structure 2 shown in FIG. 7 and FIG. 8. FIG. 11 is a schematic cross-sectional view of a structure 3 shown in FIG. 7 and FIG. 8. Note that the matters already described in the First Embodiment are omitted below, and the descriptions given above are appropriately incorporated by reference.

A display device 1 according to the present embodiment may have the same configuration as that of the display device 1 according to the previous embodiment except that a light-emitting element 20 illustrated in FIG. 5 is included in place of the light-emitting element 10. The light-emitting element 20 according to the second embodiment includes an intermediate layer 21 between the hole transport layer 16 and the light-emitting layer 17. Except for the above-described points, each layer of the light-emitting element 20 according to the second embodiment includes the same layer structure and material as those of the layers of the light-emitting element 10 according to the first embodiment. In other words, in the light-emitting element 20 according to the second embodiment, similar to the previous first embodiment, the hole transport layer 16 contains the compound of one or more of Cu$^+$, Ag$^+$, and Au$^+$, and one or more of I$^-$, SCN$^-$, SeCN$^-$, and CN$^-$.

Here, in the first embodiment and the second embodiment, the hole transport layer 16 contains one or more of I$^-$, SCN$^-$, SeCN$^-$, and CN$^-$, and thus the hole transport layer 16 contains a halide compound or a pseudohalide compound.

In a case where the halide compound or the pseudohalide compound is present in the vicinity of the quantum dot luminescent body, an electrochemical reaction may occur due to voltage application or the like to the quantum dot luminescent body. The electrochemical reaction includes substitution of the halide compound or the pseudohalide compound with the ligand of the quantum dot luminescent body or direct coordination of the halide compound or the pseudohalide compound to the quantum dot luminescent body.

The ligand of the quantum dot luminescent body is substituted with the halide compound or the pseudohalide compound, and thus the quantum dot luminescent body may be deactivated. The halide compound or the pseudohalide compound is newly coordinated with the quantum dot luminescent body, and thus a change in conductivity of the quantum dot luminescent body occurs, causing a decrease in the luminous efficiency of the quantum dot luminescent body.

Also in the second embodiment, the hole transport layer 16 present in the vicinity of the light-emitting layer 17 contains the halide compound or the pseudohalide compound. For this reason, the electrochemical reaction described above may occur between the halide compound or the pseudohalide compound of the hole transport layer 16 and the quantum dot luminescent body of the light-emitting layer 17, and may cause a decrease in the luminous efficiency of the light-emitting layer 17.

In view of this, it is conceivable to insert the intermediate layer 21 between the hole transport layer 16 and the light-emitting layer 17 (quantum dot layer). As a result, the hole transport layer 16 and the light-emitting layer 17 are separated by the intermediate layer 21, and it is hence expected that the electrochemical reaction between the halide compound or the pseudohalide compound of the hole transport layer 16 and the quantum dot luminescent body of the light-emitting layer 17 is suppressed. However, in a case where the intermediate layer 21 contains a metal oxide, the ionic bonding oxygen atom contained in the metal oxide causes an unintended oxide to be generated at an interface between the hole transport layer 16 and the intermediate layer 21, and thus the luminous efficiency of the quantum dot luminescent body is reduced due to the oxide.

In the light-emitting element 20 according to the second embodiment, a thin film that is not a metal oxide is formed as the intermediate layer 21. As a result, in the second embodiment, the generation of the oxide at the interface between the hole transport layer 16 and the intermediate layer 21 can be suppressed. Transport efficiency of the positive holes from the hole transport layer 16 to the light-emitting layer 17 can be improved. Thus, it is preferable to form an insulating layer that does not contain the metal oxide between the hole transport layer 16 and the light-emitting layer 17.

A case where the metal oxide is contained as the intermediate layer will be described below using FIG. 6 and Table 1.

FIG. 6 describes an example of a case where M$_x$O being the metal oxide is contained as the intermediate layer 21, CuSCN is contained as the hole transport layer 16, an emission layer (EML) such as QD is contained as the light-emitting layer 17, and ZnO is contained as the electron transport layer 18. Note that "M" refers to a metal here.

As illustrated in FIG. 6, in a case where the metal oxide is contained as the intermediate layer 21, a layer (oxide layer) 22 of oxide (CuO in FIG. 6) of the hole transport layer 16 is generated at the interface between the intermediate layer 21 and the hole transport layer 16. CuO is generated by a reaction between Cu contained in CuSCN serving as the hole transport layer 16 and O contained in M$_x$O serving as the intermediate layer 21, and is a semiconductor, but exhibits a narrow band gap and p-type conduction.

CuO has an electron affinity equal to or higher than the electron affinity of a material (a red light-emitting layer and a green light-emitting layer) forming the light-emitting layer 17 as illustrated in Table 1. CuO has a shallower ionization potential than the ionization potential of CuSCN. Thus, the oxide layer 22 forms a potential well with respect to both the electrons and the positive holes.

Thus, an electron 23 injected from the cathode 19 is easily injected from the light-emitting layer 17 into the oxide layer 22, and a positive hole 24 injected from the anode 15 is less likely to be injected from the oxide layer 22 into the light-emitting layer 17. As a result, both the electron 23 and the positive hole 24 are easily retained in the oxide layer 22, and non-light-emitting recombination is likely to occur in the oxide layer 22.

Thus the probability of light-emitting recombination between the electron 23 and the positive hole 24 injected from each electrode in the light-emitting layer 17 decreases, and thus the light-emission characteristics are deteriorated.

In the present embodiment, by using the insulating layer that does not include the metal oxide as the intermediate layer 21, formation of the oxide layer 22 can be suppressed, and the deterioration in the light-emission characteristics of the light-emitting layer 17 can be suppressed.

TABLE 1

|  | Ionization potential (eV) | Electron affinity (eV) |
|---|---|---|
| Red light-emitting layer | 5.6 | 3.6 |
| Green light-emitting layer | 5.6 | 3.3 |
| CuSCN | 5.5 | 1.5 |
| CuO | 5.3 | 4.1 |

The insulating layer that does not contain the metal oxide can be formed at low cost by, for example, containing a non-conductive organic polymer. As the non-conductive organic polymer, polyvinyl alcohol (PVA), polystyrene (PS), polyacrylate, polyvinyl pyrrolidone (PVP), carboxymethyl-cellulose (CMC), polymethylmethacrylate (PMMA), poly-silsesquioxane (PSQ), polydimethylsiloxane (PDMS), or the like may be used. The non-conductive organic polymer may be used alone, or a plurality of non-conductive organic polymers may be used in combination.

The insulating layer that does not contain the metal oxide is a nitride of a substance containing, for example, one or more of Ti, Nb, Al, Si, Mg, Ta, Hf, Zr, Y, La, and Sr, and thus even when the thickness of the insulating layer is made smaller than that of the insulating layer using the non-conductive organic polymer, it is possible to separate the hole transport layer 16 and the light-emitting layer 17. Thus, the thickness of the insulating layer using the nitride of the substance containing one or more of Ti, Nb, Al, Si, Mg, Ta, Hf, Zr, Y, La, and Sr can be made small, and the light-emitting element 20 can be miniaturized. Thus, the insulating layer is preferably the nitride of the substance containing, for example, one or more of Ti, Nb, Al, Si, Mg, Ta, Hf, Zr, Y, La, and Sr.

Such an insulating layer is a carbide of a substance containing, for example, one or more of Ti, Nb, Al, Si, Mg, Ta, Hf, Zr, Y, La, and Sr, and thus even when the thickness of the insulating layer is made smaller than that of the insulating layer using the non-conductive organic polymer, it is possible to separate the hole transport layer 16 and the light-emitting layer 17. Thus, the thickness of the insulating layer using the carbide of the substance containing one or more of Ti, Nb, Al, Si, Mg, Ta, Hf, Zr, Y, La, and Sr can be made small, and the light-emitting element 20 can be miniaturized, Thus, the insulating layer is preferably the carbide of the substance containing, for example, one or more of Ti, Nb, Al, Si, Mg, Ta, Hf, Zr, Y, La, and Sr.

Note that in the insulating layer, the non-conductive organic polymer, the nitride of the substance containing one or more of Ti, Nb, Al, Si, Mg, Ta, Hf, Zr, Y, La, and Sr, and the carbide of the substance containing one or more of Ti, Nb, Al, Si, Mg, Ta, Elf, Zr, Y, La, and Sr may be used alone, or may be used in combination of two or more.

The thickness of the intermediate layer 21 is 1 nm or more, and thus the intermediate layer 21 does not have an island shape, which can prevent the contact between the hole transport layer 16 and the light-emitting layer 17, The thickness of the intermediate layer 21 is 10 nm or less, and thus electrons can be efficiently injected from the light-emitting layer 17 into the hole transport layer 16 by the tunneling effect. The thickness of the intermediate layer 21 is preferably 1 nm or more and 10 nm or less.

As a method of forming the intermediate layer 21, in a case where the thin film is formed of PMMA as the inter-mediate layer 21, the intermediate layer 21 can be formed by film formation of a coating solution in which PMMA is dissolved in a fixed amount of acetone, by the spin coating method.

The luminance and an external quantum effect in light-emitting particles of structures illustrated in FIG. 9 to FIG. 11 are evaluated using FIG. 7 and FIG. 8. FIG. 9 illustrates the light-emitting element of the structure 1 formed by sequentially layering the array substrate 11, the anode 15, the hole transport layer 16, the light-emitting layer 17, the electron transport layer 18, and the cathode 19 from the lower layer. The light-emitting element of the structure 1 is a light-emitting element obtained by forming an ITO layer having a thickness of 30 nm as the anode 15, forming a CuSCN layer having a thickness of 50 nm as the hole transport layer 16, forming a layer containing the quantum dot luminescent bodies having a thickness of 50 nm as the light-emitting layer 17, forming a ZnO layer having a thickness of 50 nm as the electron transport layer 18, and forming an Al layer having a thickness of 100 am as the cathode 19.

FIG. 10 illustrates a light-emitting element of the structure 2 formed by sequentially layering the array substrate 11, the anode 15, the hole transport layer 16, the intermediate layer 21, the light-emitting layer 17, the electron transport layer 18, and the cathode 19 from the lower layer. The light-emitting element of the structure 2 is a light-emitting element obtained by forming an ITO layer having a thickness of 30 nm as the anode 15, forming a CuSCN layer having a thickness of 50 nm as the hole transport layer 16, forming a PMMA layer having a thickness of 5 nm as the intermediate layer 21, forming a layer containing the quantum dot luminescent bodies having a thickness of 50 nm as the light-emitting layer 17, forming a ZnO layer having a thickness of 50 nm as the electron transport layer 18, and forming an Al layer having a thickness of 100 nm as the cathode 19.

FIG. 11 illustrates a light-emitting element of the structure 3 formed by sequentially layering the array substrate 11, the anode 15, the hole transport layer 16, the intermediate layer 21, the light-emitting layer 17, the electron transport layer 18, and the cathode 19 from the lower layer. The light-emitting element of the structure 3 is a light-emitting element obtained by forming an ITO layer having a thickness of 30 nm as the anode 15, forming a CuSCN layer having a thickness of 50 nm as the hole transport layer 16, forming an $Al_2O_3$ layer having a thickness of 1.5 nm as the intermediate layer 21, forming a layer containing the quantum dot luminescent bodies having a thickness of 50 nm as the light-emitting layer 17, forming a ZnO layer having a thickness of 50 nm as the electron transport layer 18, and forming an Al layer having a thickness of 100 nm as the cathode 19.

As shown in FIG. 7 and FIG. 8, it can be seen that the light-emitting element of the structure 2 is superior to the light-emitting elements of the structure 1 and the structure 3 in both the luminance and the external quantum effect. In the structure 1 that does not form the intermediate layer, the luminance and the external quantum efficiency are improved, as compared with the structure 3 containing the metal oxide ($Al_2O_3$) containing the ionic bonding oxygen as the intermediate layer.

Third Embodiment

Figure 12:
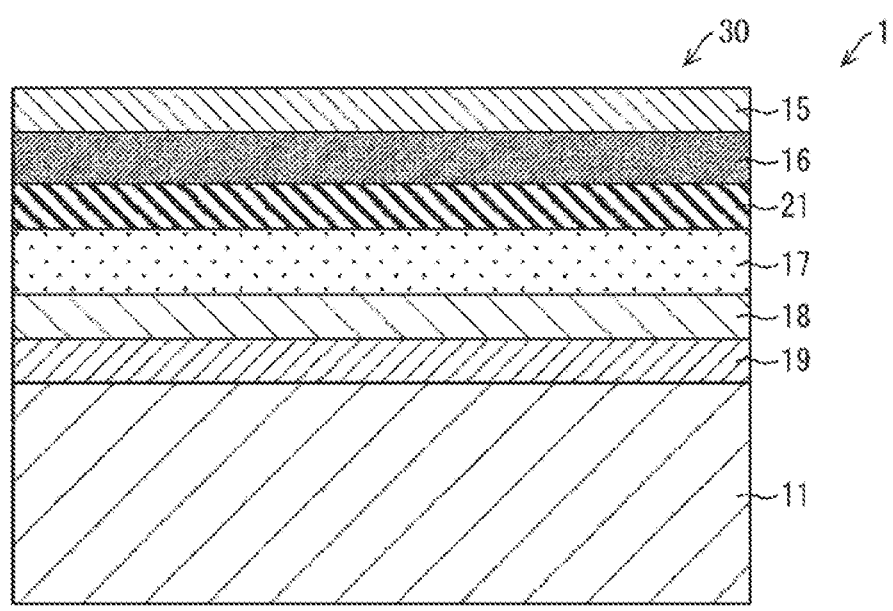
FIG. 12 is a schematic cross-sectional view of a display device according to a third embodiment of the disclosure.

A light-emitting element according to a third embodiment of the disclosure will be described with reference to FIG. 12. Note that the matters already described in the First Embodiment and the Second Embodiment are omitted below, and the descriptions described above are appropriately incorporated by reference. FIG. 12 is a schematic cross-sectional view of a display device 1 according to the present embodiment.

The display device 1 according to the present embodiment may have the same configuration as that of the display device 1 according to the first embodiment except that a light-emitting element 30 illustrated in FIG. 12 is included in place of the light-emitting element 10. The light-emitting element 30 according to the present embodiment may have the same configuration as that of the light-emitting element 20 according to the previous embodiment except that the layering order of the layers viewed from the array substrate 11 is reversed, Specifically, the light-emitting element 30 according to the present embodiment includes the electron transport layer 18, the light-emitting layer 17, the intermediate layer 21, the hole transport layer 16, and the anode 15 sequentially layered on the cathode 19 from the array substrate 11 side. As described above, the display device 1 including the light-emitting element 30 according to the third embodiment is the inverted structure type display device in which the cathode 19 is disposed as an electrode closest to the array substrate 11.

In the display device 1 including the light-emitting element 30 according to the third embodiment, in a case where the top-emitting type display device is formed, the anode 15 is the transparent conductive film including the transparent oxide such as ITO, IZO, ZnO, AZO, or BZO. The cathode 19 may be an electrode formed of a metal, and may be an electrode formed of the transparent conductive film.

For example, in a case where the display device 1 according to the present embodiment forms a bottom-emitting type display device, Ag may be commonly used for the anode 15, and Al/IZO may be used for the cathode 19. The light-emitting element 30 is illustrated in a case where the intermediate layer 21 is provided, but the intermediate layer 21 need not necessarily be provided.

In the light-emitting element 30 according to the third embodiment, the hole transport layer 16 is layered on the intermediate layer 21. Since the intermediate layer 21 has a low conductivity, in the method of forming the CuSCN thin film by performing electrodeposition with respect to an electrolysis solution in which copper (II) sulfate and potassium thiocyanate are dissolved in ethylenediaminetetraacetic acid, the electrodeposition of the hole transport layer 16 cannot be performed well, and thus the method is not suitable. Thus, in a case where the CuSCN thin film is formed as the hole transport layer 16, the hole transport layer 16 made of a material having weak polarization may be formed by a method of forming a coating solution by dissolving the CuSCN powder in a mixed solution of diethylsulfide, propylsulfide, or aminopropanol, and methoxyethanol, and forming the hole transport layer 16 by a spin coating method.

Supplement

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A light-emitting element comprising:
a hole transport layer;
a light-emitting layer including a quantum dot luminescent body, the hole transport layer and the light-emitting layer being layered on top of each other; and
an intermediate layer between the hole transport layer and the light-emitting layer,
wherein the hole transport layer includes a compound of one or more of $Cu^+$, $Ag^+$, and $Au^+$, and one or more of $I^-$, $SCN^-$, $SeCN^-$, and $CN^-$,
wherein a thickness of the intermediate layer is 1 nm or more and 10 nm or less,
wherein the intermediate layer is an insulating layer not including a metal oxide,
wherein the insulating layer includes a nitride of a substance including one or more of Nb, Mg, Ta, Y, La, and Sr, or a carbide of a substance including one or more of Ti, Nb, Si, Mg, Ta, Hf, Zr, Y, La, and Sr, and
wherein the insulating layer further includes a non-conductive organic polymer.

2. The light-emitting element according to claim 1, wherein the compound is CuSCN.

3. A display device comprising:
a plurality of subpixels,
wherein each of the plurality of subpixels includes the light-emitting element according to claim 1, and a thin film transistor configured to control light emission of the light-emitting element.

4. A light-emitting element comprising:
a hole transport layer;
a light-emitting layer including a quantum dot luminescent body, the hole transport layer and the light-emitting layer being layered on top of each other; and
an intermediate layer between the hole transport layer and the light-emitting layer,
wherein the hole transport layer includes a compound of one or more of $Cu^+$, $Ag^+$, and $Au^+$, and one or more of $I^-$, $SCN^-$, $SeCN^-$, and $CN^-$,
wherein the intermediate layer is an insulating layer not including a metal oxide, and
wherein the insulating layer includes a non-conductive organic polymer and includes a nitride of a substance including one or more of Nb, Mg, Ta, Y, La, and Sr, or a carbide of a substance including one or more of Ti, Nb, Si, Mg, Ta, Hf, Zr, Y, La, and Sr.

5. The light-emitting element according to claim 4, wherein the compound is CuSCN.

6. A display device comprising:
a plurality of subpixels,
wherein each of the plurality of subpixels includes the light-emitting element according to claim 4, and a thin film transistor configured to control light emission of the light-emitting element.

* * * * *